(12) United States Patent
Taylor et al.

(10) Patent No.: US 8,622,021 B2
(45) Date of Patent: Jan. 7, 2014

(54) HIGH LIFETIME CONSUMABLE SILICON NITRIDE-SILICON DIOXIDE PLASMA PROCESSING COMPONENTS

(75) Inventors: Travis R. Taylor, Fremont, CA (US); Mukund Srinivasan, Fremont, CA (US); Bobby Kadkhodayan, Pleasanton, CA (US); K. Y. Ramanujam, Fremont, CA (US); Biljana Mikijelj, Cerritos, CA (US); Shanghua Wu, Irvine, CA (US)

(73) Assignees: Lam Research Corporation, Fremont, CA (US); Ceradyne Inc., Costa Mesa, CA (US)

( * ) Notice: Subject to any disclaimer, the term of this patent is extended or adjusted under 35 U.S.C. 154(b) by 360 days.

(21) Appl. No.: 12/740,091

(22) PCT Filed: Oct. 27, 2008

(86) PCT No.: PCT/US2008/012173
§ 371 (c)(1),
(2), (4) Date: Oct. 7, 2010

(87) PCT Pub. No.: WO2009/058235
PCT Pub. Date: May 7, 2009

(65) Prior Publication Data
US 2011/0021031 A1 Jan. 27, 2011

Related U.S. Application Data

(60) Provisional application No. 61/001,113, filed on Oct. 31, 2007.

(51) Int. Cl.
| C23C 16/50 | (2006.01) |
| C23C 16/22 | (2006.01) |
| H01L 21/306 | (2006.01) |
| C23F 1/00 | (2006.01) |
| B22F 3/04 | (2006.01) |
| B22F 3/15 | (2006.01) |
| C23C 16/44 | (2006.01) |

(52) U.S. Cl.
USPC ............ 118/723 R; 156/345.35; 156/345.36; 156/345.41; 156/345.42; 156/345.43; 156/345.44; 156/345.45; 156/345.46; 156/345.47; 156/345.48; 419/49; 419/68

(58) Field of Classification Search
USPC ............... 118/723 R; 156/345.35–345.36, 156/345.41–345.48; 419/49, 68
See application file for complete search history.

(56) References Cited

U.S. PATENT DOCUMENTS 4,511,402 A 4/1985 Miura et al.
4,761,134 A * 8/1988 Foster ........................ 432/253

(Continued)

FOREIGN PATENT DOCUMENTS

JP 08-133840 A 5/1996
JP 8-208340 A 8/1996

(Continued)

OTHER PUBLICATIONS

Machine Translation for JP 2000026166 A. http://www19.ipdl.inpit.go.jp/PA1/cgi-bin/PA1INDEX.*

(Continued)

Primary Examiner — Rudy Zervigon
(74) Attorney, Agent, or Firm — Buchanan Ingersoll & Rooney PC

(57) ABSTRACT

A method of increasing mean time between cleans of a plasma etch chamber and chamber parts lifetimes is provided. Semiconductor substrates are plasma etched in the chamber while using at least one sintered silicon nitride component exposed to ion bombardment and/or ionized halogen gas. The sintered silicon nitride component includes high purity silicon nitride and a sintering aid consisting of silicon dioxide. A plasma processing chamber is provided including the sintered silicon nitride component. A method of reducing metallic contamination on the surface of a silicon substrate during plasma processing is provided with a plasma processing apparatus including one or more sintered silicon nitride components. A method of manufacturing a component exposed to ion bombardment and/or plasma erosion in a plasma etch chamber, comprising shaping a powder composition consisting of high purity silicon nitride and silicon dioxide and densifying the shaped component.

8 Claims, 6 Drawing Sheets

(56) References Cited

U.S. PATENT DOCUMENTS

| | | | |
|---|---|---|---|
| 5,280,156 A * | 1/1994 | Niori et al. | 219/385 |
| 5,534,751 A | 7/1996 | Lenz et al. | |
| 5,800,618 A * | 9/1998 | Niori et al. | 118/723 E |
| 5,993,594 A * | 11/1999 | Wicker et al. | 156/345.34 |
| 6,073,577 A | 6/2000 | Lilleland et al. | |
| 6,120,640 A * | 9/2000 | Shih et al. | 156/345.1 |
| 6,506,254 B1 * | 1/2003 | Bosch et al. | 118/715 |
| 6,620,520 B2 * | 9/2003 | O'Donnell et al. | 428/469 |
| 6,744,212 B2 | 6/2004 | Fischer et al. | |
| 6,753,507 B2 * | 6/2004 | Fure et al. | 219/444.1 |
| 6,805,952 B2 | 10/2004 | Chang et al. | |
| 6,808,747 B1 * | 10/2004 | Shih et al. | 427/249.5 |
| 6,830,622 B2 * | 12/2004 | O'Donnell et al. | 118/715 |
| 7,119,032 B2 * | 10/2006 | Ji et al. | 438/758 |
| 7,275,309 B2 * | 10/2007 | Matsuda et al. | 29/611 |
| 7,300,537 B2 * | 11/2007 | O'Donnell et al. | 156/345.51 |
| 7,311,797 B2 * | 12/2007 | O'Donnell et al. | 156/345.51 |
| 7,544,916 B2 * | 6/2009 | Okajima et al. | 219/443.1 |
| 7,582,367 B2 * | 9/2009 | Aihara et al. | 428/701 |
| 7,632,356 B2 * | 12/2009 | Tomita et al. | 118/728 |
| 7,696,117 B2 * | 4/2010 | Sun et al. | 501/134 |
| 7,802,539 B2 * | 9/2010 | Bosch | 118/723 E |
| 7,806,984 B2 * | 10/2010 | Kuibira et al. | 118/725 |
| 7,837,798 B2 * | 11/2010 | Kuibira et al. | 118/728 |
| 8,021,743 B2 * | 9/2011 | Lin et al. | 428/220 |
| 8,231,986 B2 * | 7/2012 | Harada et al. | 428/702 |
| 8,304,701 B2 * | 11/2012 | Akatsuka et al. | 219/532 |
| 2005/0150866 A1 * | 7/2005 | O'Donnell et al. | 216/67 |
| 2005/0241771 A1 * | 11/2005 | Rattner et al. | 156/345.51 |
| 2008/0029032 A1 * | 2/2008 | Sun et al. | 118/728 |
| 2008/0264565 A1 * | 10/2008 | Sun et al. | 156/345.1 |
| 2008/0318431 A1 * | 12/2008 | Ohmi et al. | 438/710 |
| 2009/0123735 A1 * | 5/2009 | O'Donnell | 428/332 |
| 2010/0160143 A1 * | 6/2010 | Sun et al. | 501/103 |
| 2011/0021031 A1 * | 1/2011 | Taylor et al. | 438/724 |
| 2012/0190530 A1 * | 7/2012 | Mikijelj | 501/97.3 |

FOREIGN PATENT DOCUMENTS

| | | | |
|---|---|---|---|
| JP | 2000026166 | | 1/2000 |
| JP | 2000026166 A * | | 1/2000 |
| KR | 10-2003-0010760 A | | 2/2003 |
| WO | WO 98/14980 | | 4/1998 |
| WO | WO 0203427 A2 | | 1/2002 |
| WO | WO 01/75932 A2 | | 10/2011 |

OTHER PUBLICATIONS

Examination Report mailed Nov. 1, 2010 for corresponding Singapore Appln. No. 201003028-6.

International Search Report and Written Opinion mailed Apr. 14, 2009 for PCT/US2008/012173.

Office Action dispatched Aug. 28, 2012 for Japanese Patent Appln. No. 2010-532026.

* cited by examiner

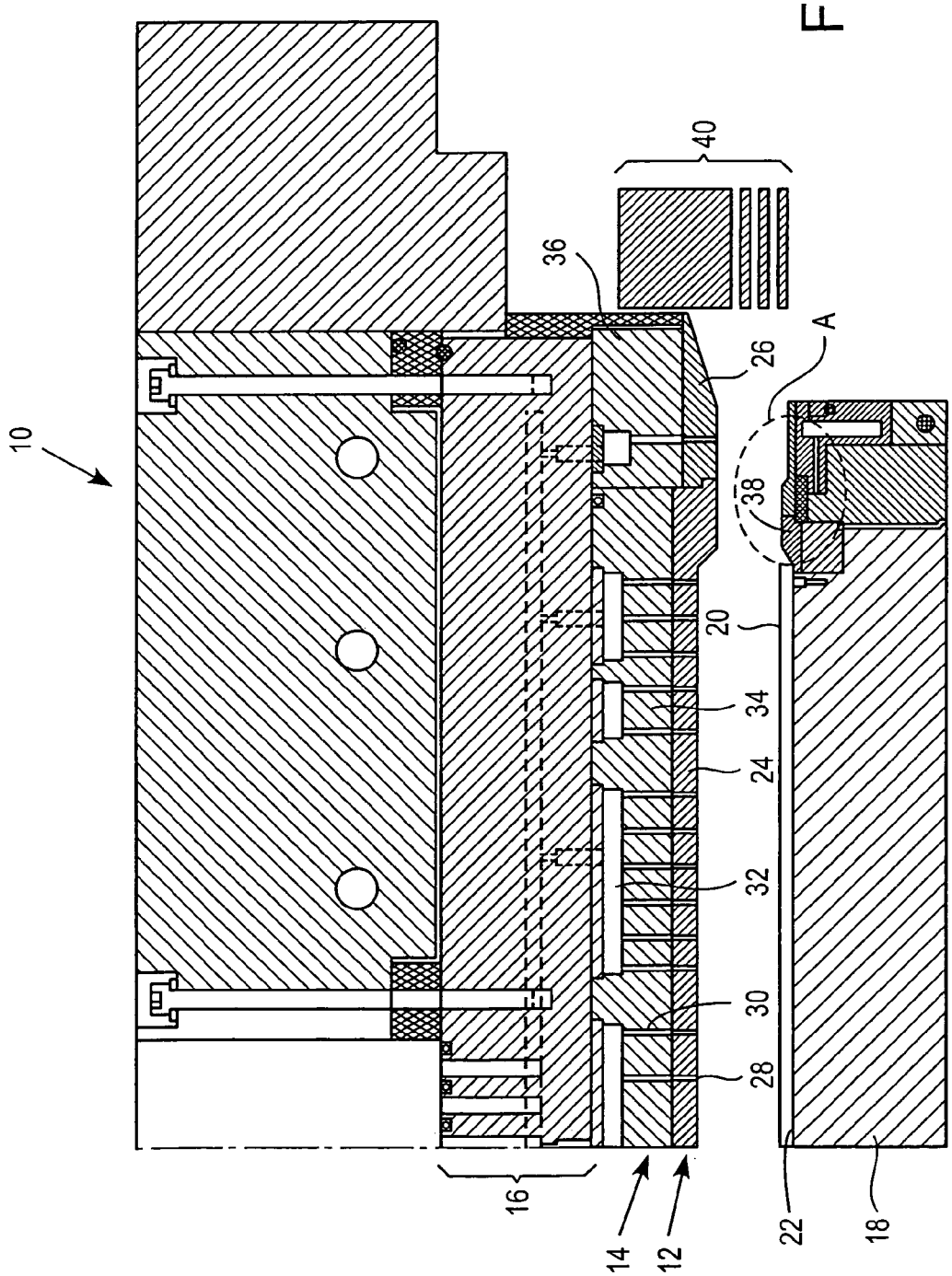

HIGH LIFETIME CONSUMABLE SILICON NITRIDE-SILICON DIOXIDE PLASMA PROCESSING COMPONENTS

This application is a national stage application under 35 USC §371 of International Application Number PCT/US2008/012173, filed Oct. 27, 2008, the international Application being published in English. This application also claims priority under 35 USC §119 to U.S. Provisional Application No. 61/001,113, filed Oct. 31, 2007, the entire content of which is hereby incorporated by reference.

BACKGROUND

Plasma processing apparatuses are used to process substrates by techniques including etching, physical vapor deposition (PVD), chemical vapor deposition (CVD), ion implantation and resist removal. One type of plasma processing apparatus used in plasma processing includes a reaction chamber containing upper and bottom electrodes. An RF generated plasma between the electrodes produces energetic ions and neutral species that etch the wafer substrate and chamber parts within the reaction chamber.

SUMMARY

A method of increasing mean time between cleans of a plasma etch chamber and chamber parts lifetimes is provided. Semiconductor substrates are plasma etched one at a time in the chamber while using at least one sintered silicon nitride component exposed to ion bombardment and/or ionized halogen gas. The silicon nitride component consists of between about 80 weight % and about 95 weight % high purity silicon nitride and between about 5 weight % and about 20 weight % sintering aid. The sintering aid consists of high purity silicon dioxide.

A plasma processing chamber is provided. A substrate holder supports a substrate within an interior of the processing chamber. A sintered silicon nitride component has an exposed surface adjacent the substrate. The component consists of between about 80 weight % and about 95 weight % high purity silicon nitride and between about 5 weight % and about 20 weight % sintering aid. The sintering aid consists of high purity silicon dioxide. A gas supply supplies process gas to the interior of the processing chamber. An energy source supplying energy into the interior of the processing chamber and energizes the process gas into a plasma state for processing the substrate. The component minimizes metallic contamination on a surface of the substrate to below $100 \times 10^{10}$ atoms/cm$^2$ during processing by the plasma.

A method of reducing metallic contamination on a surface of a silicon substrate during plasma processing is provided. A silicon substrate is placed on a substrate support in a reaction chamber of a plasma processing apparatus. The plasma processing apparatus including one or more sintered silicon nitride components. The silicon nitride components consist of between about 80 weight % and about 95 weight % high purity silicon nitride and between about 5 weight % and about 20 weight % sintering aid. The sintering aid consisting of high purity silicon dioxide. A process gas is introduced into the reaction chamber. A plasma is generated from the process gas. The silicon substrate is processed with the plasma.

A method of manufacturing a plasma etch chamber processing component exposed to ion bombardment and/or plasma erosion in a plasma etch chamber is provided. A powder composition is mixed, consisting of between about 80 weight % and about 95 weight % high purity silicon nitride and between about 5 weight % and about 20 weight % silicon dioxide. A shaped component is formed from the powder composition. The shaped component is densified with a simultaneous application of heat and pressure.

A plasma processing component is provided. The component comprises a sintered silicon nitride component, wherein the component consists of between about 80 weight % and about 95 weight % high purity silicon nitride and between about 5 weight % and about 20 weight % sintering aid. The sintering aid consists of high purity silicon dioxide.

BRIEF DESCRIPTION OF FIGURES

FIG. 1 illustrates a portion of an embodiment of a showerhead electrode assembly and a substrate support for a plasma processing apparatus.

DETAILED DESCRIPTION

Figure 2A:
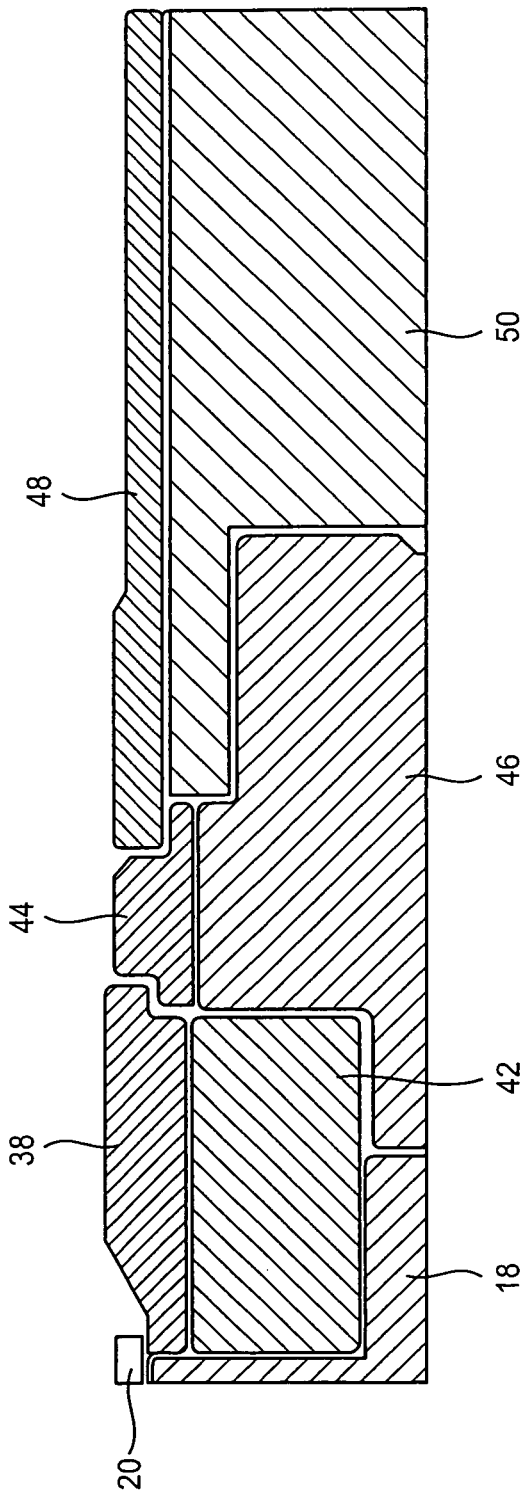
FIGS. 2A-2B illustrate a portion of the substrate support for a plasma processing apparatus surrounding the hot edge ring.

As integrated circuit devices continue to shrink in both their physical size and their operating voltages, their associated manufacturing yields become more susceptible to particle and metallic impurity contamination. Consequently, fabricating integrated circuit devices having smaller physical sizes requires that the level of particulate and metal contamination be less than previously considered to be acceptable.

The manufacturing of the integrated circuit devices includes the use of plasma etching chambers, which are capable of etching selected layers defined by a photoresist mask. The processing chambers are configured to receive processing gases (i.e., etch chemistries) while a radio frequency (RF) power is applied to one or more electrodes of the processing chamber. The pressure inside the processing chamber is also controlled for the particular process. Upon applying the desired RF power to the electrode(s), the process gases in the chamber are activated such that a plasma is created. The plasma is thus generated to perform the desired etching of the selected layers of the semiconductor wafer.

The plasma etch conditions create significant ion bombardment of the surfaces of the processing chamber that are exposed to the plasma. This ion bombardment, combined with plasma chemistries and/or etch byproducts, can produce significant erosion, corrosion and corrosion-erosion of the plasma-exposed surfaces of the processing chamber. As a result, surface materials are removed by physical and/or chemical attack, including erosion, corrosion and/or corrosion-erosion. This attack causes problems including short part lifetimes, increased parts costs, particulate contamination, on-wafer transition metal contamination and process drift. Parts with relatively short lifetimes are commonly referred to as consumables. If the consumable part's lifetime is short, then the cost of ownership is high. Erosion of consumables and other parts generates particulate contamination in plasma processing chambers.

In addition, control of particulate contamination on the surfaces of semiconductor wafers during the fabrication of integrated circuits is essential in achieving reliable devices and obtaining a high yield. Processing equipment, such as plasma processing apparatuses, can be a source of particulate contamination. The desired metal contamination levels on wafer surfaces during etching operations in the plasma chamber are being reduced aggressively for new generations of semiconductor technology. On-wafer metal contamination specifications of $5\times10^{10}$ atoms/cm$^2$ for metals are currently required for state-of the art semiconductor device manufacture in a plasma etch reactor. Examples of metallic contamination include aluminum, barium, calcium, cerium, chromium, copper, gallium, indium, iron, lithium, magnesium, nickel, potassium, sodium, strontium, tin, titanium, vanadium, yttrium, zinc or zirconium.

FIG. 1 illustrates an exemplary embodiment of a showerhead electrode assembly 10 for a plasma processing apparatus in which semiconductor substrates, e.g., silicon wafers, are processed. The showerhead electrode assembly 10 includes a showerhead electrode including a top electrode 12, a backing member 14 secured to the top electrode 12, and a thermal control plate 16. A substrate support 18 (only a portion of which is shown in FIG. 1) including a bottom electrode and an electrostatic clamping electrode (e.g., electrostatic chuck) is positioned beneath the top electrode 12 in the vacuum processing chamber of the plasma processing apparatus. A substrate 20 subjected to plasma processing is electrostatically clamped on a top support surface 22 of the substrate support 18.

In the illustrated embodiment, the top electrode 12 of the showerhead electrode includes an inner electrode member 24, and an optional outer electrode member 26. The inner electrode member 24 is preferably a cylindrical plate (e.g., a plate composed of silicon). The inner electrode member 24 can have a diameter smaller than, equal to, or larger than a wafer to be processed, e.g., up to 12 inches (300 mm) if the plate is made of silicon. In a preferred embodiment, the showerhead electrode assembly 10 is large enough for processing large substrates, such as semiconductor wafers having a diameter of 300 mm or larger. For 300 mm wafers, the top electrode 12 is at least 300 mm in diameter. However, the showerhead electrode assembly can be sized to process other wafer sizes or substrates having a non-circular configuration.

In the illustrated embodiment, the inner electrode member 24 is wider than the substrate 20. For processing 300 mm wafers, the outer electrode member 26 is provided to expand the diameter of the top electrode 12 from about 15 inches to about 17 inches. The outer electrode member 26 can be a continuous member (e.g., a continuous poly-silicon ring), or a segmented member (e.g., including 2-6 separate segments arranged in a ring configuration, such as segments composed of silicon). In embodiments of the top electrode 12 that include a multiple-segment, outer electrode member 26, the segments preferably have edges, which overlap each other to protect an underlying bonding material from exposure to plasma.

The inner electrode member 24 preferably includes multiple gas passages 28 extending through and in correspondence with multiple gas passages 30 formed in the backing member 14 for injecting process gas into a space in a plasma processing chamber located between the top electrode 12 and the substrate support 18. Backing member 14 includes multiple plenums 32 to distribute process gases to the gas passages 28 and 30 in the inner electrode member 24 and backing member 14, respectively.

Silicon is a preferred material for plasma exposed surfaces of the inner electrode member 24 and the outer electrode member 26. High-purity, single crystal silicon minimizes contamination of substrates during plasma processing and also wears smoothly during plasma processing, thereby minimizing particles. Alternative materials that can be used for plasma-exposed surfaces of the top electrode 12 include SiC or AlN, for example.

In the illustrated embodiment, the backing member 14 includes a backing plate 34 and a backing ring 36, extending around the periphery of backing plate 34. In the embodiment, the inner electrode member 24 is co-extensive with the backing plate 34, and the outer electrode member 26 is co-extensive with the surrounding backing ring 36. However, the backing plate 34 can extend beyond the inner electrode member 24 such that a single backing plate can be used to support the inner electrode member 24 and the segmented outer electrode member 26. The inner electrode member 24 and the outer electrode member 26 are preferably attached to the backing member 14 by a bonding material.

The backing plate 30 and backing ring 36 are preferably made of a material that is chemically compatible with process gases used for processing semiconductor substrates in the plasma processing chamber, and is electrically and thermally conductive. Exemplary suitable materials that can be used to make the backing member 14 include aluminum, aluminum alloys, graphite and SiC.

The top electrode 12 can be attached to the backing plate 34 and backing ring 36 with a suitable thermally and electrically conductive elastomeric bonding material that accommodates thermal stresses, and transfers heat and electrical energy between the top electrode 12 and the backing plate 34 and backing ring 36. The use of elastomers for bonding together surfaces of an electrode assembly is described, for example, in commonly-owned U.S. Pat. No. 6,073,577, which is incorporated herein by reference in its entirety.

In a capacitively coupled RF plasma reactor for processing large substrates such as 300 mm wafers, a secondary ground may also be used in addition to the ground electrode. For example, substrate support 18 can include a bottom electrode which is supplied RF energy at one or more frequencies, process gas can be supplied to the interior of the chamber through showerhead electrode 12 which is a grounded upper electrode. A secondary ground, located outwardly of the bottom electrode in substrate support 18 can include an electrically grounded portion which extends generally in a plane containing the substrate 20 to be processed but separated by a hot edge ring 38. Hot edge ring 38 can be of electrically conductive or semiconductive material which becomes heated during plasma generation.

Additionally, a plasma confinement ring assembly 40 can be provided outwardly of backing plate 34 and backing ring 36. The plasma confinement ring assembly 40 and secondary ground can aid in confining the plasma in the space located between the top electrode 12 and the substrate support 18. A detailed discussion of plasma confinement rings and secondary grounds used in RF capacitively coupled plasma reactors can be found in commonly assigned U.S. Pat. Nos. 5,534,751 and 6,744,212, both of which are hereby incorporated by reference. With confined plasma, there is little or no contamination caused by the chamber walls. Thus, confined plasmas provide a level of cleanliness that is not provided by unconfined plasmas. For example, confinement ring assembly 40 can be composed of quartz.

Figure 2B:
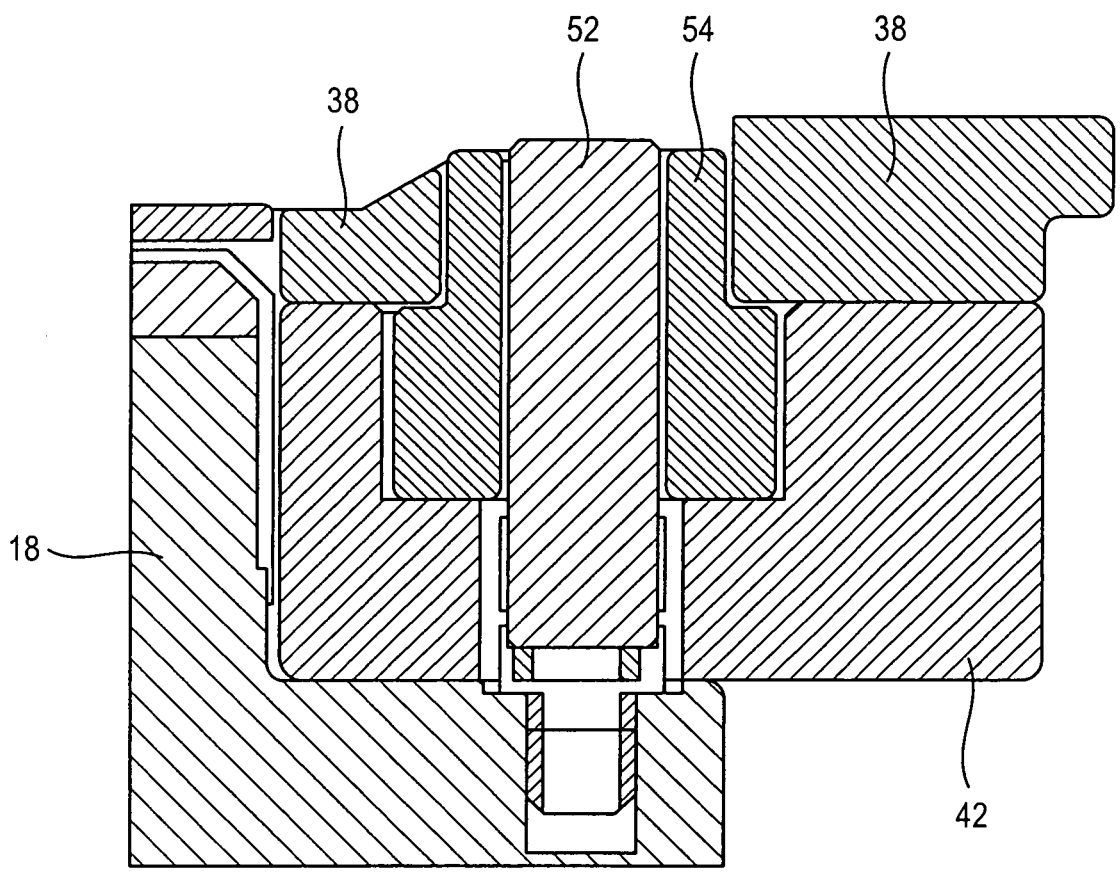

FIGS. 2A and 2B are an enlarged views of the region A in FIG. 1 surrounding hot edge ring 38. For control of etch rate uniformity on substrate 20 and matching the etch rate at the center of the substrate to the rate at the substrate edge, substrate boundary conditions are preferably designed for assuring continuity across the substrate in regard to the chemical exposure of the substrate edge, process pressure, and RF field strength. In the current designs, a hot edge ring 38 has been implemented to fit around the substrate 20. In order to minimize substrate contamination, the hot edge ring 38 is manufactured from a material compatible to the wafer itself. As an example, hot edge ring materials can include silicon, graphite, silicon carbide or the like.

Hot edge ring 38 overlies coupling ring 42 which is placed on the outer periphery of substrate support 18. The material for coupling ring 42 is chosen for tapering the RF field strength at the edge of the substrate 20 to enhance etch rate uniformity. For example, coupling ring 42 can be made of a ceramic (e.g. quartz) or a conductive material.

Surrounding hot edge ring 38 is hot edge ring cover 44, which is composed of a dielectric material. Hot edge ring cover 44 overlies focus ring 46, which confines plasma in an area above the substrate 20 and can be composed of quartz. Further surrounding hot edge ring cover 44 is ground ring cover 48. Hot edge ring cover 44 protects the ground extension from attack by the plasma. For example, hot edge ring cover 44 and ground ring cover 48 can be composed of quartz. Ground extension 50 can be composed of aluminum.

As illustrated in FIG. 2B, conductive pin 52 and pin sleeve 54 can be contained within hot edge ring 38 and coupling ring 42. Conductive pin 52 monitors the RF bias voltage in the electrostatic chuck of substrate support 18 during plasma processing, which is used to determine overall characteristics of the plasma. For example, conductive pin 52 can be composed of silicon carbide or any conductive material. Pin sleeve 54 surrounds conductive pin 52 and electrically isolates conductive pin 52. For example, pin sleeve 54 can be composed of quartz.

Quartz can be used as the material of the interior surfaces of consumable parts. However, quartz has the shortest RF lifetime of the consumable materials present in a plasma chamber. The replacement of consumable materials and associated mean time between cleanings (MTBC) for plasma chambers is application specific. Currently, the MTBC for high aspect ratio contact (HARC) applications using the 2300 EXELAN FLEX® dielectric etch system, manufactured by Lam Research Corporation (Fremont, Calif.) is dictated by the replacement of a quartz components at about 250 RF hours. In view of the foregoing, there is a need for high density plasma processing chambers having consumable parts that are more resistant to erosion and assist in minimizing contamination (e.g., particles and metallic impurities) of the wafer surfaces being processed.

Silicon nitride has been demonstrated to be material suitable for plasma processing components, such as gas distribution plates, liners, and focus rings for use in plasma processing chambers, as described in commonly-owned U.S. Pat. No. 5,993,594.

Such silicon nitride components can be made in various ways. For instance, the silicon nitride can be hot pressed at temperatures above 1500° C. using a powder that contains a high percentage of alpha silicon nitride. During hot pressing at such temperatures, the alpha phase transforms to the beta-modification and transformation and densification are dependent on the pressure, temperature and alpha/beta phase ratio of the starting powders. Sintering aids for silicon nitride can include MgO, $Y_2O_3$, $CeO_2$, $ZrO_2$, $Al_2O_3$, $Y_3Al_5O_{12}$ (yttrium aluminum garnet or YAG) and possibly other rare-earth oxides. The densification can be carried by sintering processes such as pressureless sintering, hot pressing, hot isostatic pressing (HIP-ing) or gas pressure sintering. Compared to hot isostatically pressed silicon nitride, the gas pressure sintered material may exhibit a coarser structure with high aspect ratio grains whereas the pressed material may have a finer, more equiaxed structure. The gas pressure sintering may be conducted using nitrogen gas pressures up to 2 MPa wherein the nitrogen gas suppresses the thermal decomposition of silicon nitride and allows higher sintering temperatures to be used for densification. Hot pressed silicon nitride can be formed by the application of heat and uniaxial pressure in graphite induction heated dies to temperatures in the range of 1650° C. to 1850° C. for 1 to 4 hours under an applied pressure of 15 to 30 MPa. Another technique involves firing a shaped component of silicon nitride at 1700° C. to 1800° C. under a nitrogen atmosphere at 0.1 MPa. Another technique involves adding additives such as MgO or $Y_2O_3$ to silicon, prior to its shaping and followed by nitridation in a temperature range of between about 1100° C. and about 1450° C. under a nitrogen atmosphere. Although metallic oxide sintering aids (e.g. MgO) facilitate the formation of dense silicon nitride components, they can potentially introduce unacceptable levels of metallic contamination on the surface of silicon wafers during plasma processing.

Silicon nitride components formed by hot pressing, containing about 1 weight % MgO sintering aid, were installed in a 2300 EXELAN FLEX® dielectric etching system to determine surface concentration of various metallic contaminants after plasma processing. This material was fully dense and was produced by blending the high purity $Si_3N_4$ powders with Mg-containing compounds, followed by hot pressing in graphite dies at temperatures above 1600° C. After hot pressing, components were ground from the hot pressed blanks and cleaned for the etching chamber use.

Testing in a 2300 EXELAN FLEX° dielectric etching system included subjecting the silicon nitride components with about 1 weight % MgO to a plasma environment for about 50 hours before determining the levels of metallic elements on the surface of a silicon wafer. A blank photoresist coated silicon wafer was exposed to a high aspect ratio contact (HARC) etching recipe for about 5 minutes. For a HARC etching recipe, a gas mixture of about 100 SCCM $C_4F_8$/about 50 SCCM $C_4F_6$/about 100 SCCM $CH_2F_2$/about 50 SCCM $O_2$/about 1,000 SCCM Ar was delivered to the process chamber with a chamber pressure of about 35 mTorr and about 40 mTorr. Between about 5,000 Watts and about 6,000 Watts of RF power was applied to generate a plasma with the $C_4F_8$/$C_4F_6$/$CH_2F_2$/$O_2$/Ar process gas. After completion, the test wafer was removed and a waferless autoclean (WAC) chamber cleaning recipe was performed for about 30 seconds. For a WAC cleaning recipe, about 300 SCCM $N_2$ and about 3,000 SCCM $O_2$ were delivered to the process chamber with a chamber pressure of about 600 mTorr. About 700 Watts of RF power was applied to generate a plasma with the $N_2/O_2$ process gases to remove polymer deposits from the interior of the processing chamber. This sequence of the HARC etching recipe followed by a WAC recipe was repeated until the silicon nitride components were exposed to plasma environment for about 50 hours. The HARC etching recipe and the WAC chamber cleaning recipe were selected because quartz is susceptible to erosion under these plasma processing conditions.

Figure 3:
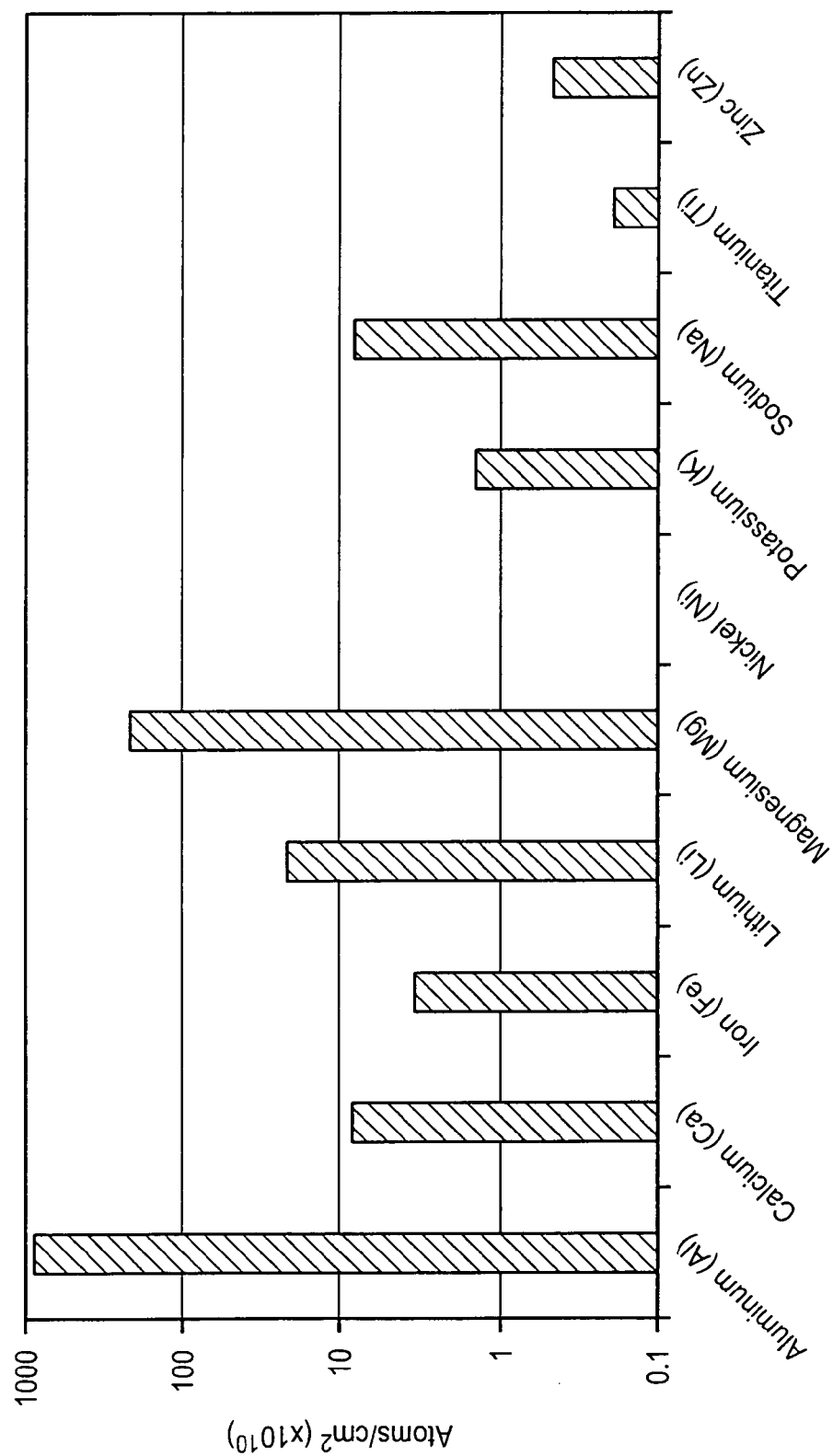
FIG. 3 illustrates metallic contamination on the surface of silicon wafers after plasma processing in a processing chamber containing silicon nitride components and a magnesium oxide sintering aid.

After the silicon nitride component was exposed to about 50 RF hours in a plasma environment, a blank uncoated 300 mm silicon test wafer was subjected to plasma processing using the HARC etching recipe for about 5 minutes. After plasma processing, the surface of the silicon wafer was rinsed with dilute nitric acid ($HNO_3$) and analyzed by inductively coupled plasma mass spectroscopy (ICP-MS) for surface concentration of various metallic contaminants (atoms/$cm^2$). FIG. 3 illustrates the surface concentration of various metallic contaminants for a blank 300 mm silicon wafer plasma processed in an etching system containing a plasma exposed silicon nitride-based component with a MgO sintering aid.

As described above, the contamination levels for metallic elements on the surface of a silicon wafer, with the exception of aluminum, is ideally $5 \times 10^{10}$ atoms/$cm^2$ or lower. As can be seen in FIG. 3, the surface contamination of magnesium exceeded $100 \times 10^{10}$ atoms/$cm^2$. Thus, for certain applications, the use of silicon nitride components with 1 weight % MgO sintering aid can produce less than completely satisfactory results, due to higher levels of magnesium and other contamination of the surface of a silicon wafer.

One approach to reducing the metallic contamination on the surface of a silicon wafer is use a sintering aids free of intentional additions of aluminum, barium, calcium, cerium, chromium, copper, gallium, indium, iron, lithium, magnesium, nickel, potassium, sodium, strontium, tin, titanium, vanadium, yttrium, zinc or zirconium. It has been determined that a high purity silicon nitride based plasma processing components containing high purity silicon dioxide as a sintering aid results in a reduction in contamination levels for metallic elements on the surface of a silicon wafer.

Silicon nitride components formed by hot isostatic pressing, containing 10 weight % silicon dioxide sintering aid, were installed in an 2300 EXELAN FLEX® dielectric etching system to determine surface concentration of various metallic contaminants after plasma processing. The process steps for fabricating the silicon nitride component are: (1) blending 90 parts (weight %) of high purity silicon nitride powder with 10 parts (weight %) of high purity silicon dioxide powder in an alcohol solvent; (2) evaporating the alcohol solvent to form a dry powder mixture; (3) loading the powder mixture in a die set and subjecting the mixed power to uniaxial dry pressing or cold isostatic pressing (CIP) between about 100 MPa and about 120 MPa, to form a green body pre-form (i.e., unfired ceramic body); and (4) hot isostatic pressing (HIP-ing) the pre-form at a temperature of between about 1750° C. and about 1900° C. at an applied pressure between about 175 MPa and about 225 MPa, for between about 60 minutes to about 120 minutes using a glass encapsulation technique.

In uniaxial dry pressing or cold isostatic pressing, the density of the green body pre-form is no less than 45% of the theoretical density. After hot isostatic pressing, the silicon nitride components were determined to have a density of about 95% or more of the theoretical density, based on optical microstructure, in which the silicon nitride component was free of pores. The silicon nitride components containing the silicon dioxide sintering aid have a total metallic contamination of below 5000 ppm, preferably below 1000 ppm, and most preferably below 100 ppm. The metallic contamination includes barium, calcium, cerium, chromium, copper, gallium, indium, iron, lithium, magnesium, nickel, potassium, sodium, strontium, tin, titanium, vanadium, yttrium, zinc and zirconium.

As described previously, testing in a 2300 EXELAN FLEX® dielectric etching system included subjecting the silicon nitride components with 10 weight % silicon dioxide sintering aid to a plasma environment for about 50 hours before determining the levels of metallic elements on the surface of a silicon wafer. A blank photoresist coated silicon wafer was exposed to a high aspect ratio contact (HARC) etching recipe for about 5 minutes. After completion, the test wafer was removed and a waferless autoclean (WAC) chamber cleaning recipe was performed for about 30 seconds. This sequence was repeated until the silicon nitride components were exposed to plasma environment for about 50 hours.

Figure 4:
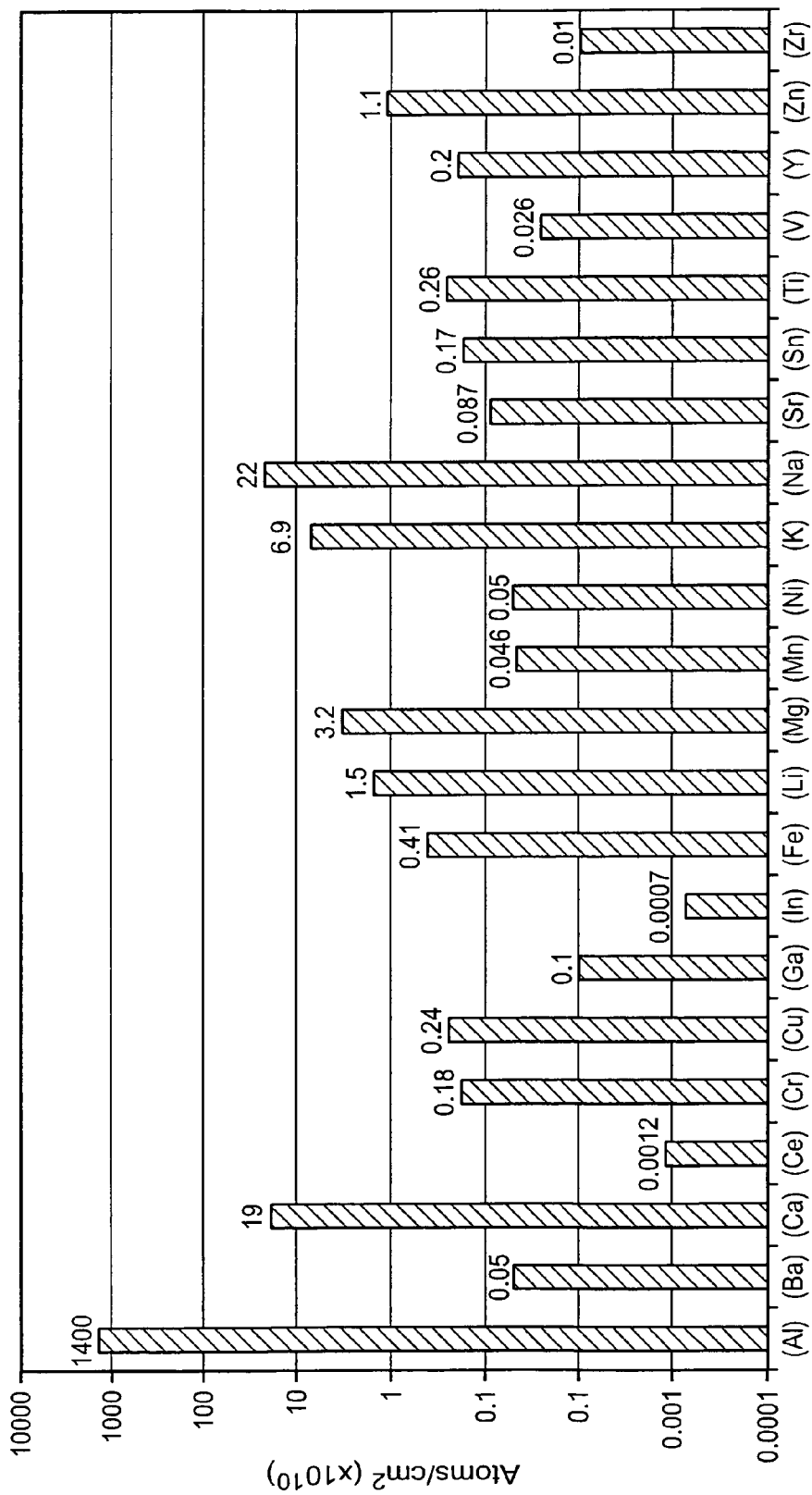
FIG. 4 illustrates metallic contamination on the surface of silicon wafers after plasma processing in a processing chamber containing silicon nitride components and a silicon dioxide sintering aid.

After plasma processing, the surface of the silicon wafer was rinsed with dilute nitric acid ($HNO_3$) and analyzed by inductively coupled plasma mass spectroscopy (ICP-MS) for surface concentration of various metallic contaminants (atoms/$cm^2$). As seen in FIG. 4, the surface contamination of magnesium was below $5 \times 10^{10}$ atoms/$cm^2$. Additionally, although calcium, lithium and sodium exceeded the $5 \times 10^{10}$ atoms/$cm^2$ contamination level, the level of these metals was below about $22 \times 10^{10}$ atoms/$cm^2$. In comparing the results of FIG. 3 and FIG. 4, the silicon nitride components containing 10% $SiO_2$ sintering aid provide for a significant improvement over silicon nitride components containing 1% MgO.

Figure 5A:
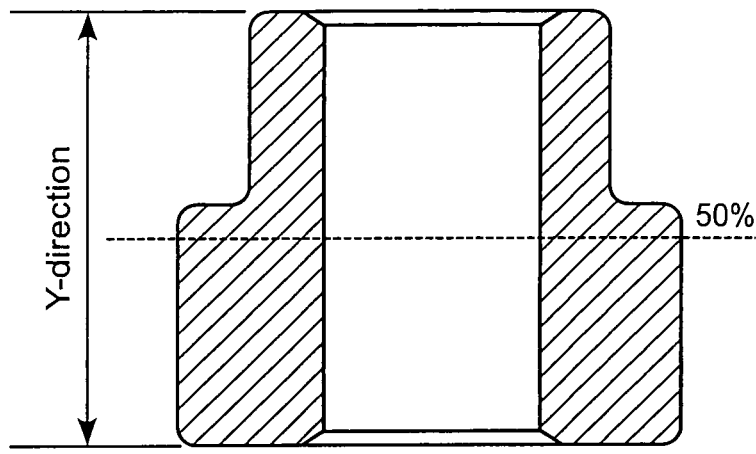
FIGS. 5A and 5B illustrate wear rate of quartz and silicon nitride components containing various amounts of silicon dioxide as a sintering aid.

Silicon nitride components formed by hot isostatic pressing containing a $SiO_2$ sintering aid also exhibited superior wear resistance properties during exposure to a fluorocarbon/hydrofluorocarbon and oxygen/nitrogen plasma in comparison to their quartz counterparts. Furthermore, it was determined that silicon nitride containing about 10 weight % $SiO_2$ sintering aid exhibited the lowest wear rate. Silicon nitride-based components (e.g., pin sleeves) containing about 5 weight %, about 10 weight %, about 20 weight % and about 35 weight % $SiO_2$ sintering aid were formed by glass encapsulated hot isostatic pressing. After diamond grinding, the material to close tolerances and after cleaning, each component was individually placed in a 2300 EXELAN FLEX® dielectric etching system and exposed to alternating HARC etching recipe for about 5 minutes followed by a WAC recipe for about 30 seconds, until the total plasma exposure was about 18 RF hours. During testing, the pin sleeve component was subjected to ion bombardment and/or ionized halogen gas. Wear rate of the pin sleeve was determined by measuring the change in the dimension in the y-direction, as indicated in FIG. 5A. The pin sleeve is replaced when its height has been worn to 50% of the height of a new pin sleeve, as indicated in FIG. 5A. In one embodiment, the height of the pin sleeve can range between about 5 mm to about 15 mm.

Figure 5B:
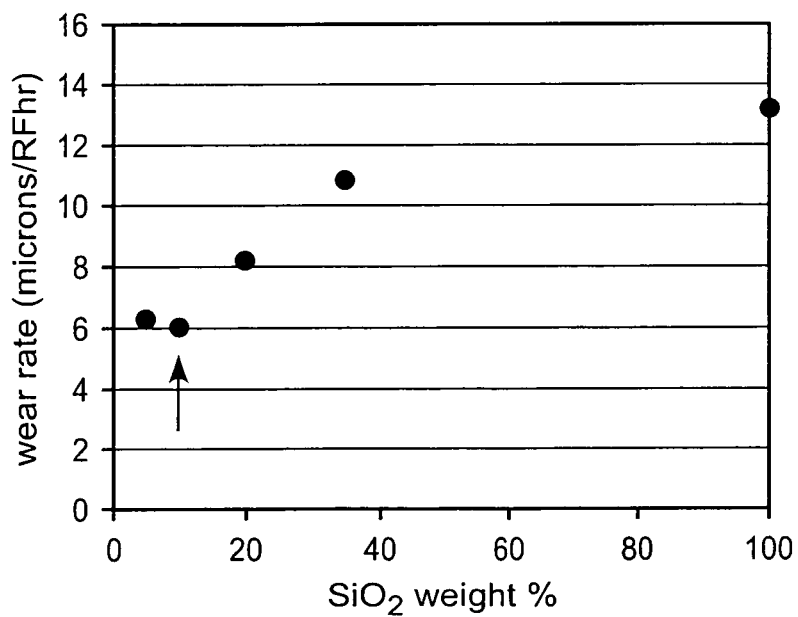

As illustrated in FIG. 5B, silicon nitride pin sleeve components containing between about 5 weight % to about 20 weight % $SiO_2$ provided improved wear rate during plasma processing, below about 8 μm/RF hour. Quartz components (i.e., 100% $SiO_2$) exhibited the highest wear rate at about 13 μm/RF hour. However, silicon nitride components containing about 10 weight % $SiO_2$ exhibited at least a two-fold decrease in wear rate, at about 6 μm/RF hour. Thus, replacing quartz consumable components with silicon nitride components containing between about 5 weight % and about 20 weight % $SiO_2$ (e.g., between about 8 weight % and about 12 weight %, between about 9 weight % and about 11 weight %, about 10 weight %) can more than double the lifetime from about 250 RF hours to between about 800 RF hours and about 1,000 RF hours.

While the foregoing has been described in detail with reference to specific embodiments thereof, it will be apparent to one skilled in the art that various changes and modifications may be made, and equivalents thereof employed, without departing from the scope of the claims.

What is claimed is:

1. A plasma processing chamber comprising:
    a substrate holder for supporting a substrate within an interior of the processing chamber;

a sintered silicon nitride component having an exposed surface adjacent the substrate, wherein the component consists of between about 80 weight % and about 95 weight % high purity silicon nitride and between about 5 weight % and about 20 weight % sintering aid, the sintering aid consisting of high purity silicon dioxide;

a gas supply supplying process gas to the interior of the processing chamber; and an energy source supplying energy into the interior of the processing chamber and energizing the process gas into a plasma state for processing the substrate, wherein the component minimizes metallic contamination on a surface of the substrate to below $100 \times 10^{10}$ atoms/cm$^2$ during processing by the plasma, wherein the component has a total metallic contamination of below 100 ppm, and wherein the component has been subjected to uniaxial pressing or cold isostatic pressing followed by hot isostatic pressing.

2. The plasma processing chamber of claim 1, wherein the component minimizes metallic contamination on the surface of the substrate to below $50 \times 10^{10}$ atoms/cm$^2$ during processing by the plasma; and the component consists of between about 80 weight % and about 93 weight % high purity silicon nitride and between about 7 weight % and about 20 weight % sintering aid.

3. The plasma processing chamber of claim 1, wherein the component minimizes metallic contamination on the surface of the substrate to below $10 \times 10^{10}$ atoms/cm$^2$ during processing by the plasma.

4. The plasma processing chamber of claim 1, wherein the component minimizes metallic contamination on the surface of the substrate to below $5 \times 10^{10}$ atoms/cm$^2$ during processing by the plasma.

5. The processing chamber of claim 1, wherein the metallic contamination includes barium, calcium, cerium, chromium, copper, gallium, indium, iron, lithium, magnesium, nickel, potassium, sodium, strontium, tin, titanium, vanadium, yttrium, zinc and zirconium.

6. The processing chamber of claim 1, wherein the process gas comprises fluorocarbons and/or hydro fluorocarbons.

7. A plasma processing component comprising:

a sintered silicon nitride component, wherein the component consists of between about 80 weight % and about 95 weight % high purity silicon nitride and between about 5 weight % and about 20 weight % sintering aid, the sintering aid consisting of high purity silicon dioxide, and wherein the silicon nitride component has a total metallic contamination of below 100 ppm, and wherein the component has been subjected to uniaxial pressing or cold isostatic pressing followed by hot isostatic pressing.

8. The plasma processing component of claim 7, wherein the component is a pin sleeve, confinement ring, hot edge ring cover or ground cover ring.

* * * * *